(12) United States Patent
Kao et al.

(10) Patent No.: US 9,564,896 B2
(45) Date of Patent: Feb. 7, 2017

(54) POST-SILICON TUNING IN VOLTAGE CONTROL OF SEMICONDUCTOR INTEGRATED CIRCUITS

(71) Applicant: TAIWAN SEMICONDUCTOR MANUFACTURING CO., LTD., Hsinchu (TW)

(72) Inventors: Jerry Chang-Jui Kao, Taipei (TW); Chien-Ju Chao, New Taipei (TW); Chin-Shen Lin, Taipei (TW); Nitesh Katta, Hsinchu (TW); Kuo-Nan Yang, Hsinchu (TW); Chung-Hsing Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 248 days.

(21) Appl. No.: 14/296,042

(22) Filed: Jun. 4, 2014

(65) Prior Publication Data

US 2015/0091543 A1    Apr. 2, 2015

Related U.S. Application Data

(60) Provisional application No. 61/884,575, filed on Sep. 30, 2013.

(51) Int. Cl.
| | |
|---|---|
| H03K 19/00 | (2006.01) |
| H02M 3/157 | (2006.01) |
| H02M 3/155 | (2006.01) |
| H02M 1/00 | (2006.01) |
| H02M 3/156 | (2006.01) |

(52) U.S. Cl.
CPC ......... *H03K 19/0013* (2013.01); *H02M 3/157* (2013.01); *H02M 3/155* (2013.01); *H02M 3/156* (2013.01); *H02M 2001/0012* (2013.01)

(58) Field of Classification Search
CPC ...... H02M 3/156; H02M 3/155; H02M 3/157; H02M 2001/0012
See application file for complete search history.

(56) References Cited

U.S. PATENT DOCUMENTS

| | | | |
|---|---|---|---|
| 8,847,628 B1* | 9/2014 | Yan | H04L 25/0272 326/115 |
| 2007/0152739 A1* | 7/2007 | Banerjee | G05F 1/56 327/538 |
| 2011/0002080 A1* | 1/2011 | Ranta | H03M 1/1061 361/277 |
| 2011/0198941 A1* | 8/2011 | Suzuki | H03K 19/0016 307/116 |
| 2012/0139624 A1* | 6/2012 | Senthinathan | G06F 1/3243 327/540 |
| 2014/0015562 A1* | 1/2014 | Dwivedi | G11C 7/08 324/762.03 |

* cited by examiner

Primary Examiner — Jue Zhang
Assistant Examiner — Lakaisha Jackson
(74) Attorney, Agent, or Firm — McDermott Will & Emery LLP

(57) ABSTRACT

A circuit is disclosed that includes a plurality of voltage control circuits and a control module. Each of the voltage control circuits is controlled by a control signal. The control module is configured to generate the control signal and to determine a voltage level or a pulse width of the control signal in accordance with a current process corner condition of the voltage control circuits and at least one of first predetermined data and second predetermined data.

20 Claims, 6 Drawing Sheets

POST-SILICON TUNING IN VOLTAGE CONTROL OF SEMICONDUCTOR INTEGRATED CIRCUITS

RELATED APPLICATIONS

This application claims priority to U.S. Provisional Application Ser. No. 61/884,575, filed Sep. 30, 2013, which is herein incorporated by reference.

BACKGROUND

In nano-scale process of semiconductor devices, power consumption sharply increases due to leakage current. In order to reduce the leakage current, a technique referred to as power gating is used. Power gating is used to supply power to a circuit in a chip when the circuit is in operation and to cut off power supplied to the circuit when the circuit is not in operation, and thus the leakage current of the circuit can be reduced.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
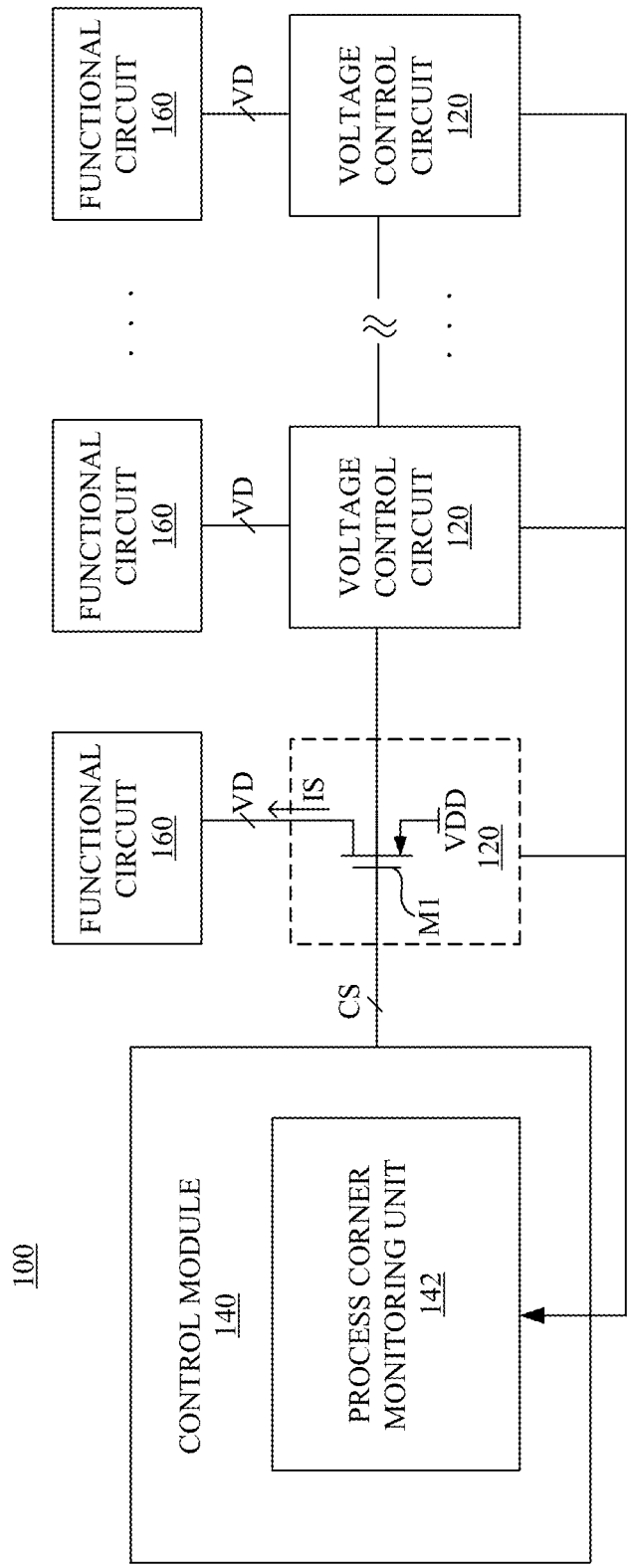
FIG. 1 is a schematic diagram of a semiconductor integrated circuit in accordance with various embodiments of the present disclosure.

FIG. 1 is a schematic diagram of a semiconductor integrated circuit 100 in accordance with various embodiments of the present disclosure.

As illustratively shown in FIG. 1, the semiconductor integrated circuit 100 includes a plurality of voltage control circuits 120 and a control module 140. The voltage control circuits 120 are electrically coupled in series to the control module 140.

Each of the voltage control circuits 120 is configured to generate a driving voltage VD for driving a corresponding functional circuit 160. In some embodiments, the functional circuit 160 is a central processing unit (CPU).

In some embodiments, as shown in FIG. 1, each of the voltage control circuits 120 includes a switch circuit M1, and the switch circuit M1 is controlled by the control signal CS. In further embodiments, the switch circuit M1 is controlled by a pulse width and/or a voltage level of the control signal CS.

When the switch circuit M1 is turned on by the control signal CS, the voltage control circuit 120 generates the driving voltage VD to drive the corresponding functional circuit 160. In some embodiments, the switch circuit M1 is implemented by a power gating switch.

For illustration, when the switch circuit M1 in FIG. 1 is turned on, an inrush current IS is generated, and flows through the switch circuit M1 to the functional circuit 160.

The control module 140 is configured to generate the control signal CS for controlling the voltage control circuits 120. The control module 140 includes a process corner monitoring unit 142. The process corner monitoring unit 142 is configured to detect a current process corner condition of the voltage control circuits 120. In the present disclosure, the current process corner condition indicates a variation of fabrication parameters used in the voltage control circuits 120.

In some approaches, the current process corner condition is a fast-fast (FF) process corner condition. The voltage control circuit 120 is operated faster in the FF process corner condition than in a typical-typical (TT) process corner condition.

In other approaches, the current process corner condition is a slow-slow (SS) process corner condition. The voltage control circuit 120 is operated slower in the FF process corner condition than in the TT process corner condition.

In some embodiments, the control module 140 is a controller chip. In various embodiments, the control module 140 is a design tool carried on a computer-readable medium. In other words, the control module 140 is implemented in hardware, software, firmware, and the combination thereof. For illustration, if speed and accuracy are determined to be paramount, a mainly hardware and/or firmware vehicle is selected and utilized. Alternatively, if flexibility is paramount, a mainly software implementation is selected and utilized.

The number of the voltage control circuits 120 in FIG. 1 is given for illustrative purposes. Other numbers of the voltage control circuits 120 are within the contemplated scope of the present disclosure. Moreover, the switch circuit M1 in FIG. 1 is given for illustrative purposes. Other types of the switch circuit are within the contemplated scope of the present disclosure.

Figure 2:
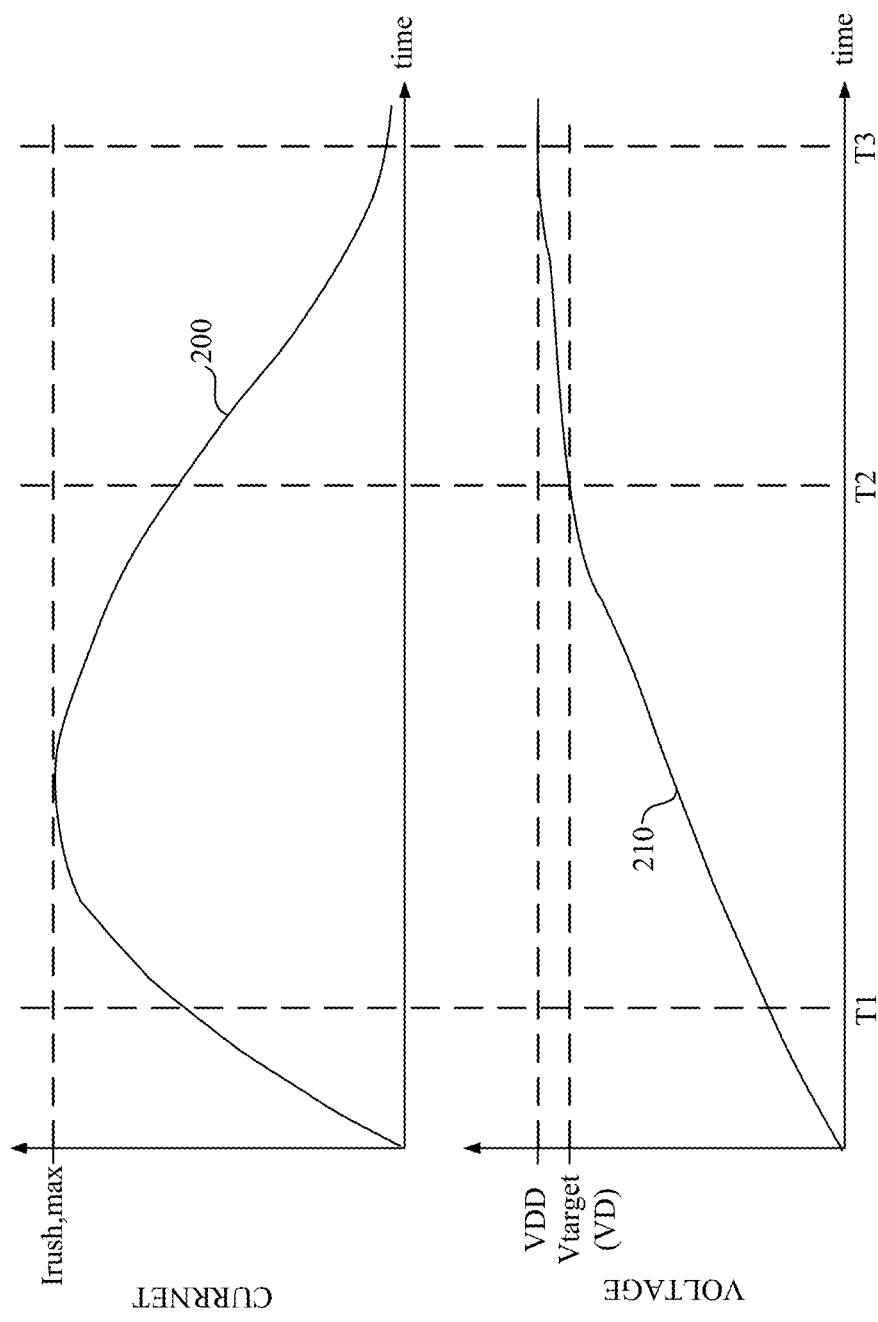
FIG. 2 is a graph illustrating an operation waveform of the inrush current and an operation waveform of the driving voltage in one of the voltage control circuits, in accordance with various embodiments of the present disclosure.

FIG. 2 is a graph illustrating an operation waveform 200 of the inrush current IS and an operation waveform 210 of the driving voltage VD in one of the voltage control circuits 120, in accordance with various embodiments of the present disclosure.

As shown in FIG. 2, when the switch circuit M1 is turned on, the inrush current IS of the voltage control circuit 120 goes through a first time period T1, a second time period T2 and a third time period T3.

During the second time period T2, the inrush current IS meets the maximum inrush current Irush,max requirement. The maximum inrush current Irush,max requirement is defined as the maximum inrush current of the voltage control circuits 120 at a fast-fast (FF) process corner condition.

During the third time period T3, the driving voltage VD meets a target voltage level. In some embodiments, the target voltage level is about 90% to about 95% of a supply voltage VDD. The minimum wake-up time is defined as the time when the driving voltage VD meets the target voltage level Vtarget of the voltage control circuits 120 at a slow-slow (SS) process corner condition.

Figure 3:
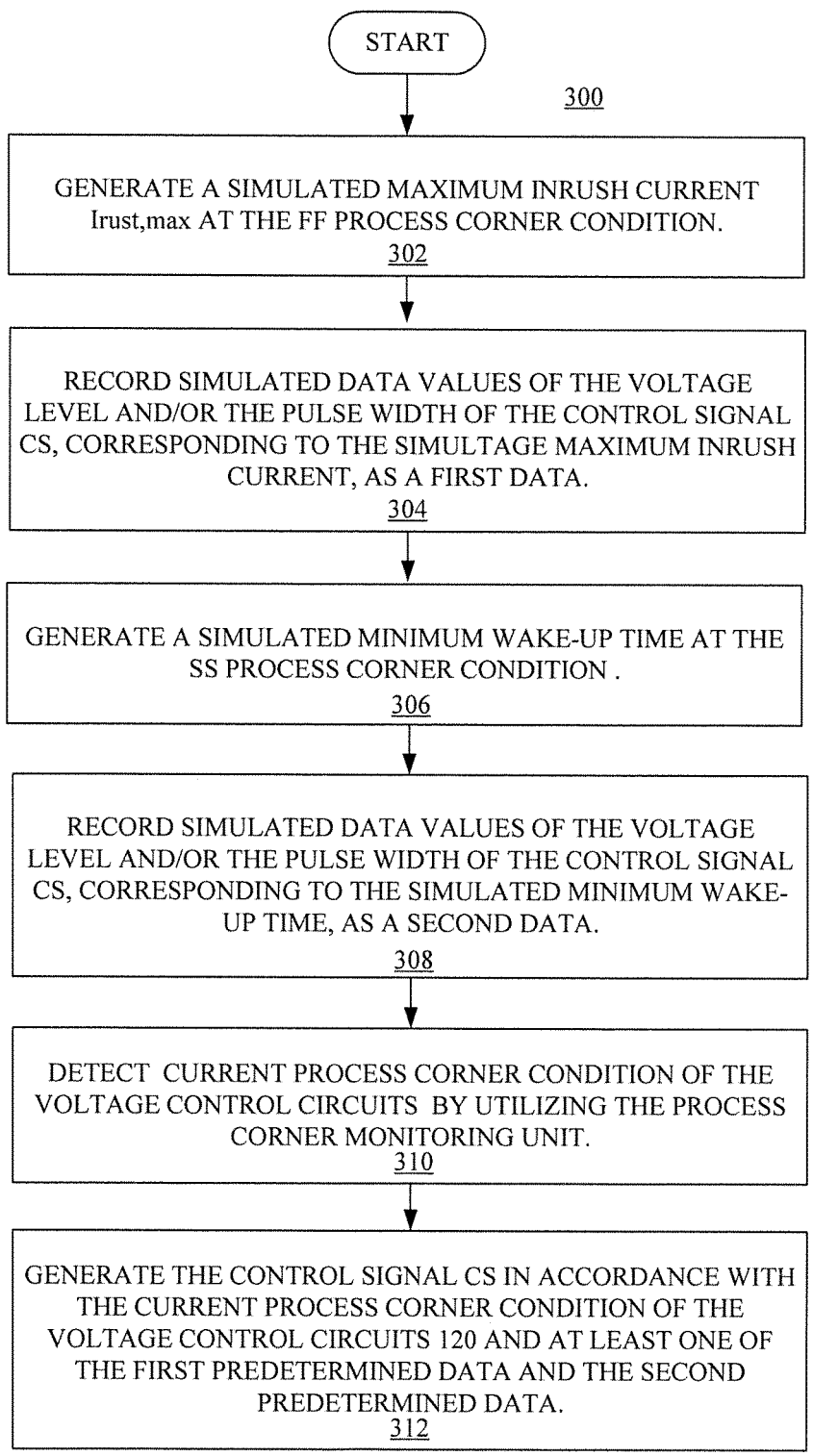
FIG. 3 is a flow chart of a method illustrating operations of the semiconductor in FIG. 1, in accordance with various embodiments of the present disclosure.

FIG. 3 is a flow chart of a method 300 illustrating operations of the semiconductor 100 in FIG. 1, in accordance with various embodiments of the present disclosure. For illustration, the operations of the voltage control circuit 120 in FIG. 1 are described by the method 300 with reference to FIG. 3.

In operation 302, a simulated maximum inrush current Irush,max at the FF process corner condition is generated. In simulation, the voltage level and/or the pulse width of the control signal CS is tuned to make the voltage control circuit 120 generate the simulated maximum rush current Irush, max at the FF process corner condition.

In operation 304, the control module 140 records simulated data values of the voltage level and/or the pulse width of the control signal CS, corresponding to the simulated maximum inrush current Irush,max, as a first predetermined data.

In some embodiments, the first predetermined data includes information of the voltage level and the pulse width of the control signal CS and the value of the maximum inrush current at the FF process corner condition.

In operation 306, a simulated minimum wake-up time at the SS process corner condition is generated. In simulation, the voltage level and/or the pulse width of the control signal CS is tuned to make the voltage control circuit 120 generates the driving voltage VD with simulated minimum wake-up time at the SS process corner condition.

In operation 308, the control module 140 records simulated data values of the voltage level and/or the pulse width of the control signal CS, corresponding to the minimum wake-up time, as a second predetermined data. In some embodiments, the second predetermined data includes information of the voltage level and the pulse width of the control signal CS. Moreover, the second predetermined data includes the value of the minimum wake up time at the SS process corner condition.

Explained in a different way, the first predetermined data indicates a simulated control configuration of the voltage circuits 120 with a maximum inrush current at the FF process corner condition from a preset simulation, and the second predetermined data indicates a simulated control configuration of the voltage circuits 120 with a minimum wake-up time at the SS process corner condition from the preset simulation.

In operation 310, the process corner monitoring unit 142 in the control module 140 detects the current process corner condition of the voltage control circuits 120.

In operation 312, the control module 140 generates the control signal CS in accordance with the current process corner condition of the voltage control circuits 120 and at least one of the first predetermined data and the second predetermined data.

Explained in a different way, the control module 140 detects the current process corner condition of the voltage control circuits 120, and then applies a more appropriate configuration to the voltage control circuits 120 by determining the voltage level and/or the pulse width of the control signal CS in accordance with at least one of the first predetermined data and the second predetermined data. The control signal CS is able to be adjusted in accordance with the current process corner condition. Thus, the voltage control circuits 120 are operated to selectively meet one of the first constraint and the second constraint or both of them. As a result, by referring to the first predetermined data and the second predetermined data, the control module 140 is able to perform a function of post-silicon tuning in power gating designs.

In some approaches, power gating designs face two power gating switch sizing constraints at an advance technology. First constraint is to decrease the size of the switch circuit M1 to meet the maximum inrush current Irush,max requirement for preventing electromigration (EM). In general, the size of switch circuit M1 is proportional to the value of the inrush current IS.

Second constraint is to increase the size of the switch circuit M1 to reduce the wake-up time. The wake-up time reduces as the size of switch circuit M1 increases, and thus the inrush current IS increases. As a result, the first constraint and the second constraint contribute to a dilemma in practice.

Compared to the aforementioned approaches, the first predetermined data having the simulated configuration of the FF process corner condition and the second predetermined data having the simulated configuration of the SS process corner condition are utilized, in order to meet the first constraint one or both of the second constraint described above.

In various embodiments, the control module 140 receives an input command to select one or both of the first predetermined data and the second predetermined data.

In some embodiments, in order to meet the second constraint, when the control module 140 receives a first command, the control module 140 determines the voltage level and/or the pulse with of the control signal CS in accordance with the first predetermined data.

In some other embodiments, in order to meet the first constraint, when the control module 140 receives a second command, the control module 140 determines the voltage level and/or the pulse with of the control signal CS in accordance with the second predetermined data.

Figure 4:
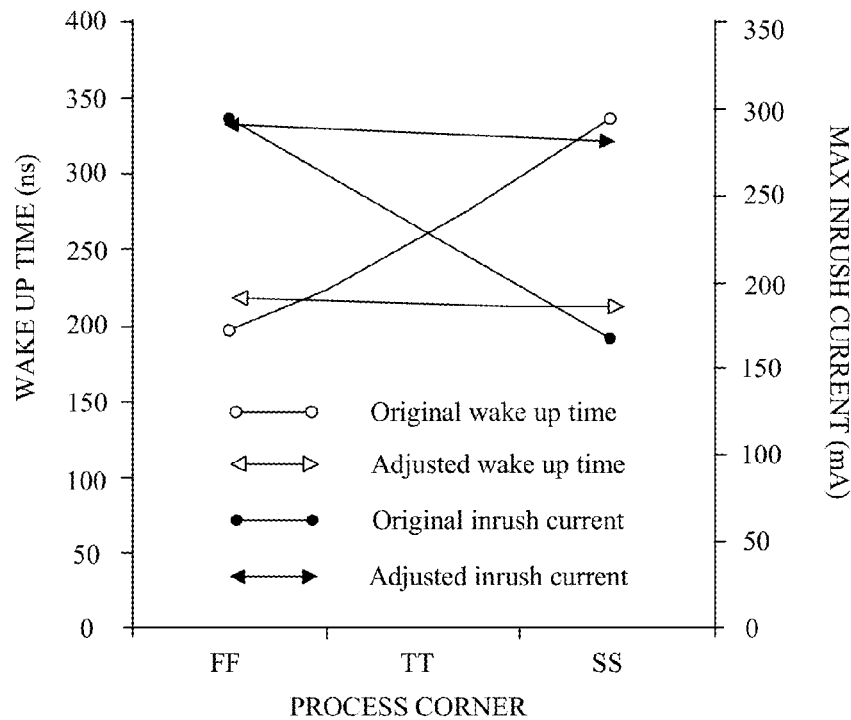
FIG. 4 is a graph illustrating operation results corresponding to the wake-up time and the maximum inrush current of the voltage control circuits in accordance with various embodiments of the present disclosure.

FIG. 4 is a graph illustrating operation results corresponding to the wake-up time and the maximum inrush current IS of the voltage control circuits 120 in accordance with various embodiments of the present disclosure.

For illustrative purposes, it's given that the current process corner condition of the voltage control circuits 120 is at a SS corner process corner condition after the voltage control circuits 120 are fabricated. In such condition, the control module 140 adjusts the voltage level and/or the pulse width of the control signal CS in accordance with the first predetermined data.

For illustration, in order to meet the second constraints for reducing the wake-up time of the voltage control circuits 120, the control module 140 increases the voltage level and/or the pulse width of the control signal CS to decrease the wake-up time of the voltage control circuits 120.

In other words, the control module 140 finds a more appropriate control configuration of the control signal CS after the voltage control circuits 120 are fabricated. As shown in FIG. 4, the control module 140 adjusts the voltage level and/or the pulse width of the control signal CS by substantially keeping the maximum inrush current IS. As a result, the wake-up time is reduced by about 63% at the SS process corner condition.

Further, in various embodiments, the control module 140 receives a third command in order to meet the both of the first and the second constraint described above. When the control module 140 receives the third command, the control module 140 determines the voltage level and/or the pulse with of the control signal CS in accordance with both of the first predetermined data and the second predetermined data.

Figure 5:
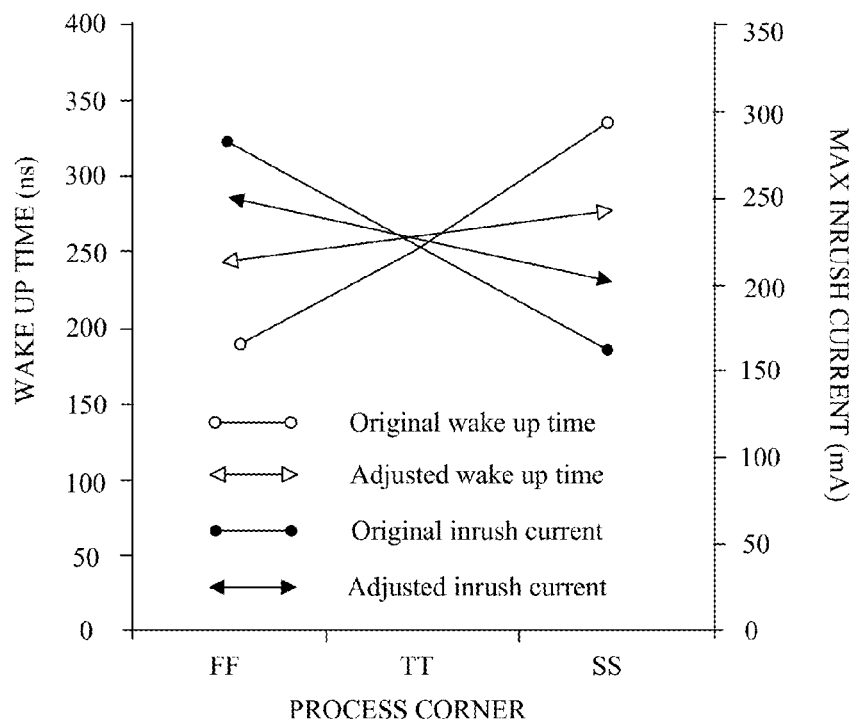
FIG. 5 is a graph illustrating operation results corresponding to the wake-up time and the maximum inrush current of the voltage control circuits in accordance with various embodiments of the present disclosure.

FIG. 5 is a graph illustrating operation results corresponding to the wake-up time and the maximum inrush current of the voltage control circuits 120 in accordance with various embodiments of the present disclosure.

For illustrative purposes, it's given that the current process corner condition of the voltage control circuits 120 is at a SS corner process corner condition after the voltage control circuits 120 are fabricated. In such condition, the control module adjusts the voltage level and/or the pulse width of the control signal CS in accordance with both of the first predetermined data and the second predetermined data.

For illustration, in order to meet both of the first and the second constraint, the control module 140 increases the voltage level and/or the pulse width of the control signal CS to decrease the wake-up time of the voltage control circuits 120. As shown in FIG. 5, the wake-up time is improved by about 18% with a small increase in the maximum inrush current Irush,max at the SS process corner condition.

Alternatively, if the current process corner condition of the voltage control circuits 120 is at a FF corner process corner condition after the voltage control circuits 120 are fabricated, the control module 140 decreases the voltage level and/or the pulse width of the control signal CS to decrease the maximum inrush current IS of the voltage control circuits 120, and thus preventing from producing electromigration on the semiconductor integrated circuit 100. AS shown in FIG. 5, the maximum inrush current is reduced by about 15% with a small increase in the wake-up time at the FF process corner condition.

Figure 6:
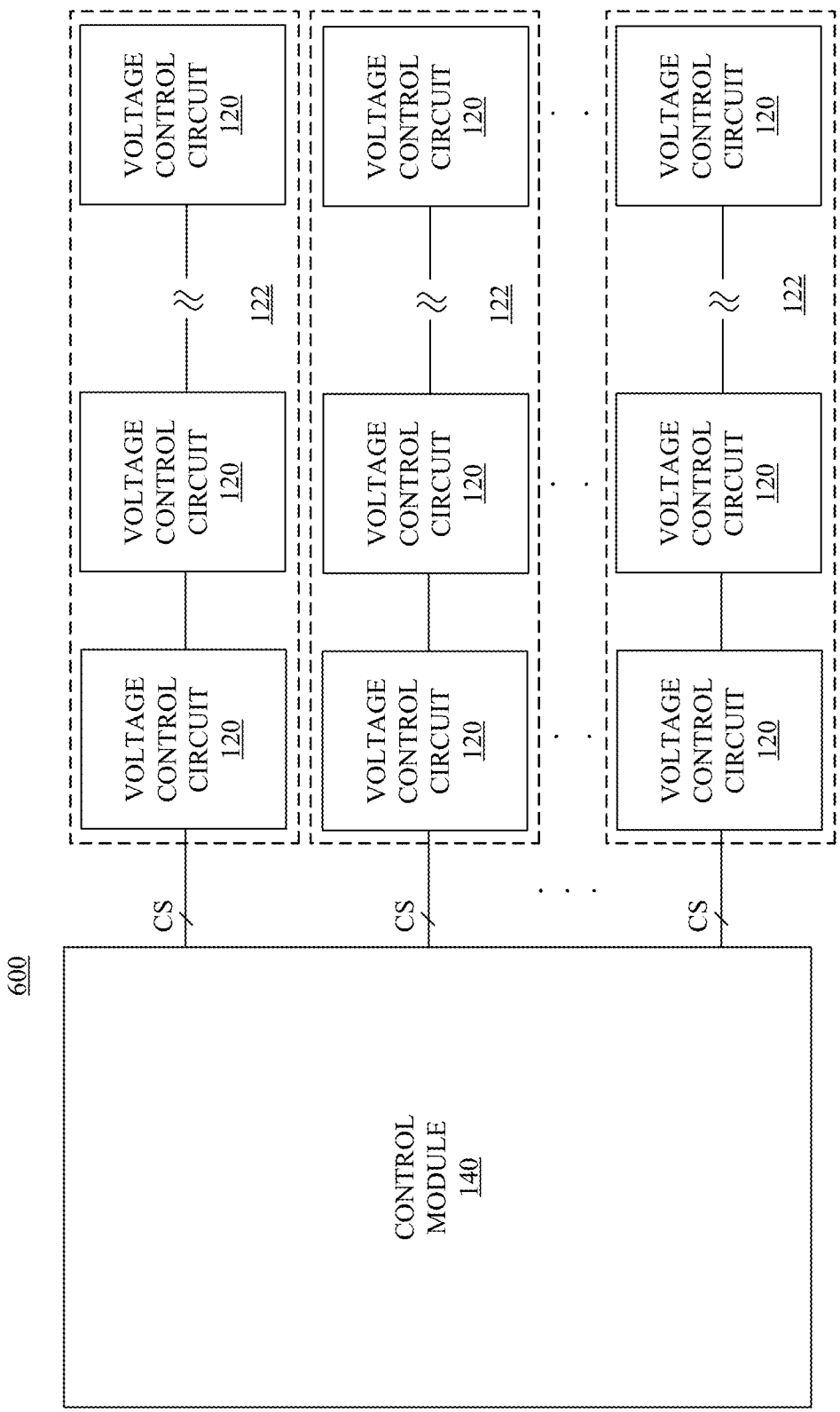
FIG. 6 is a schematic diagram of a semiconductor integrated circuit in accordance with various embodiments of the present disclosure.

FIG. 6 is a schematic diagram of a semiconductor integrated circuit 600 in accordance with various embodiments of the present disclosure.

Figure 7:
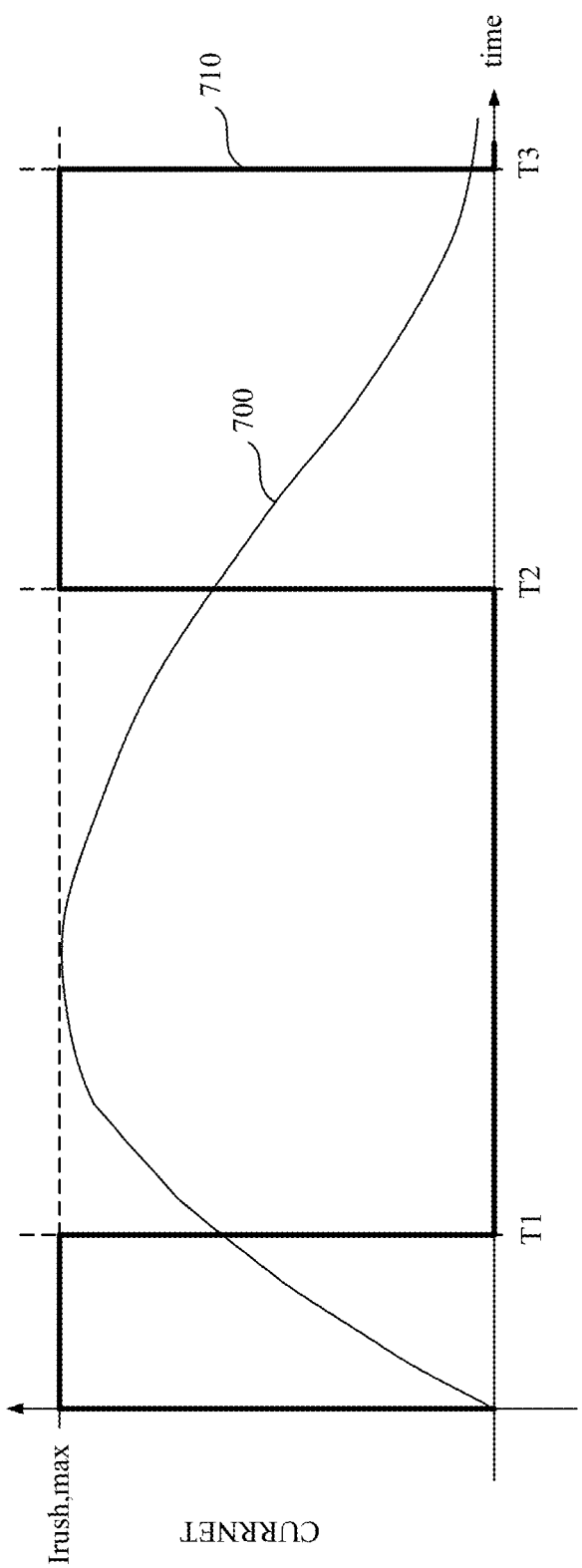
FIG. 7 is a graph illustrating an operation waveform of the inrush current in one of the voltage control circuits in FIG. 6 and an operation waveform of total current of the control chains in FIG. 6, in accordance with various embodiments of the present disclosure.

FIG. 7 is a graph illustrating an operation waveform 700 of the inrush current IS in one of the voltage control circuits 120 in FIG. 6, and an operation waveform 710 of a total current of the control chains 122 in FIG. 6, in accordance with various embodiments of the present disclosure.

The operation of the semiconductor integrated circuit 600 in FIG. 6 is described below. Details of the waveforms in FIG. 7 are explained with reference to FIG. 6.

Compared to FIG. 1, in the semiconductor integrated circuit 600 in FIG. 6, the voltage control circuits 120 are grouped into a plurality of control chains 122. The voltage control circuits 120 in each of the control chains 122 are coupled in series. Each of the control chains 122 is configured to receive a corresponding control signal CS to drive the corresponding functional circuit 160 (as shown in FIG. 1).

As explained above, regarding the waveform 700 in FIG. 7, when each of the voltage control circuits 120 is turned on, the inrush current IS of each of the voltage control circuits 120 goes through the first time period T1, the second time period T2 and the third time period T3, illustrated in FIG. 2. Accordingly, regarding the waveform 710 in FIG. 7, the total current of the control chains 122 goes through the first time period T1, the second time period T2 and the third time period T3 as well.

In various embodiments in FIG. 6, the control module 140 is further configured to activate at least one of the control chains 122 when a total current of the activated control chains 122 is less than a sum of maximum inrush currents of the voltage control circuits 120. Thus, the wake-up time of the semiconductor integrated circuit 600 is improved.

For illustration, in the first time period T1, the control module 140 activates as many as possible of the control chains 122 when the total current of the activated control chains 122 does not exceed the maximum inrush current requirement. In the second time period T2, the control module 140 keeps a few of the control chains 122 being activated to prevent the total current of the activated control chains 122 from exceeding the maximum inrush current requirement. In the third time period T3, the control module 140 activates as many as possible of the control chains 122 when the total current of the activated control chains 122 does not exceed the maximum inrush current requirement again. The waveform 710 in FIG. 7 is a resulting current waveform of total current of the control chains 122 being activated.

Therefore, compared to a single chain of voltage control circuits 120 in FIG. 1, at least one of the control chains 122 is activated in advance, and thus the wake-up time of the semiconductor integrated circuit 600 is further reduced.

In some embodiments, according to the similar ideas, the control module 140 utilizes the control signal CS with a first pulse width and/or a first voltage level to activate at least one of the control chains 122 in the first time period T1 and the third time period T3. The control module utilizes the control signal CS with a second pulse width and/or a second voltage level to keep a few of the control chains 122 being activated in the second time period T2. In some embodiments, the first pulse width is longer than the second pulse width, and the first voltage level is higher the second voltage level.

In some embodiments, a circuit is disclosed that includes a plurality of voltage control circuits and a control module. Each of the voltage control circuits is controlled by a control signal. The control module is configured to generate the control signal and to determine a voltage level or a pulse width of the control signal in accordance with a current process corner condition of the voltage control circuits and at least one of first predetermined data and second predetermined data.

Also disclosed is a circuit that includes a plurality of control chains and a control module. Each of the control chains includes a plurality of voltage control circuits electrically coupled in series. Each of the voltage control circuits is controlled by a control signal. The control module is configured to receive an input command for generating the control signal in accordance with a current process corner condition of the voltage control circuits and at least one of first predetermined data and second predetermined data.

Also disclosed is a method that includes the operations below. A current process corner condition of a plurality of voltage control circuits is detected. A control signal is generated from a control module in accordance with current process corner condition and at least one of first predetermined data and second predetermined data, and each of the voltage control circuits is configured to generate a driving voltage when turned on by the control signal.

In this document, the term "coupled" may be termed as "electrically coupled", and the term "connected" may be termed as "electrically connected". "Coupled" and "connected" may also be used to indicate that two or more elements cooperate or interact with each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit, comprising:
a plurality of voltage control circuits, wherein each of the voltage control circuits is configured to generate a driving voltage and an inrush current to a corresponding functional circuit according to a control signal; and
a control module configured to generate the control signal and to determine a voltage level or a pulse width of the control signal in accordance with a current process corner condition of the voltage control circuits and at least one of first predetermined data associated with a maximum value of the inrush current, and second predetermined data associated with a minimum time for the driving voltage meeting a target level.

2. The circuit of claim 1, wherein the first predetermined data indicates a simulated configuration of the voltage control circuits at a fast-fast (FF) process corner condition, and the second predetermined data indicates a simulated configuration of the voltage control circuits at a slow-slow (SS) process corner condition.

3. The circuit of claim 1, wherein the first predetermined data comprises a plurality of simulated data values of the voltage level and the pulse width of the control signal, when each of the voltage control circuits generates a maximum inrush current at a fast-fast (FF) process corner condition.

4. The circuit of claim 3, wherein the voltage control circuits are grouped into a plurality of control chains, the voltage control circuits are coupled in series in the control chains, the control module is further configured to activate at least one of the control chains when a total current of the control chains being activated is less than a sum of the maximum inrush currents of the voltage control circuits.

5. The circuit of claim 4, wherein the control module generates the control signal with a first pulse width to activate the at least one of the control chains in a first time period, the control module generates the control signal with a second pulse width to keep a number of the control chains being activated in a second time period, and the first pulse width is longer than the second pulse width.

6. The circuit of claim 4, wherein the control module generates the control signal with a first voltage level to activate the at least one of the control chains in a first time period, the control module generates the control signal with a second voltage level to keep a number of the control chains being activated in a second time period, and the first voltage level is higher than the second voltage level.

7. The circuit of claim 1, wherein the second predetermined data comprises a plurality of simulated data values of the voltage level and the pulse width of the control signal, when the voltage control circuit generates a driving voltage with a minimum operation time at a slow-slow (SS) process corner condition.

8. A circuit comprising:
a plurality of control chains, each of the control chains comprising:
a plurality of voltage control circuits electrically coupled in series, each of the voltage control circuits configured to generate a driving voltage and an inrush current to a corresponding functional circuit according to a control signal; and
a control module configured to receive an input command for generating the control signal in accordance with a current process corner condition of the voltage control circuits and at least one of first predetermined data associated with a maximum value of the inrush current, and second predetermined data associated with a minimum time for the driving voltage meeting a target level.

9. The circuit of claim 8, wherein the first predetermined data indicates a simulated configuration of the voltage control circuits at a fast-fast (FF) process corner condition, the second predetermined data indicates a simulated configuration of the voltage control circuits at a slow-slow (SS) process corner condition.

10. The circuit of claim 8, wherein the first predetermined data comprises a plurality of simulated data values of a voltage level and a pulse width of the control signal when each of the voltage control circuits generates a maximum inrush current at a fast-fast (FF) process corner condition.

11. The circuit of claim 10, wherein the control module is further configured to activate at least one of the control chains when a total current of the control chains being activated is less than a sum of maximum inrush currents of the voltage control circuits.

12. The circuit of claim 8, wherein the second predetermined data comprises a plurality of simulated data values of the voltage level and the pulse width of the control signal when each of the voltage control circuits generates a driving voltage with a minimum operation time at a slow-slow (SS) process corner condition.

13. The circuit of claim 8, wherein the control module generates the control signal in accordance with one or both of the first predetermined data and the second predetermined data corresponding to the input command.

14. A method, comprising:
   detecting a current process corner condition of a plurality of voltage control circuits, wherein each of the voltage control circuits is configured to generate a driving voltage and an inrush current to a corresponding functional circuit according to a control signal; and
   generating the control signal by a control module in accordance with the current process corner condition and at least one of first predetermined data associated with a maximum value of the inrush current, and second predetermined data associated with a minimum time for the driving voltage meeting a target level.

15. The method of claim 14, further comprising:
   generating a maximum inrush current by the voltage control circuits at a fast-fast (FF) process corner condition;
   recording simulated data values of a voltage level and a pulse width of the control signal, corresponding to the maximum inrush current, as the first predetermined data;
   generating the driving voltage with a minimum operation time by the voltage control circuits at a slow-slow (SS) process corner condition; and
   recording simulated data values of a voltage level and a pulse width of the control signal, corresponding to the minimum operation time, as the second predetermined data.

16. The method of claim 14, wherein the generating the control signal by the control module comprises:
   generating the control signal in accordance with one of the first predetermined data and the second predetermined data, when the control module receives a corresponding input command.

17. The method of claim 14, wherein the generating the control signal by the control module comprises:
   generating the control signal in accordance with both of the first predetermined data and the second predetermined data, when the control module receives a corresponding input command.

18. The method of claim 14, wherein the voltage control circuits are grouped into a plurality of control chains, the voltage control circuits are electrically coupled in series in the control chains, and each of control chains is electrically coupled to the control module for receiving the corresponding control signal, the method further comprises:
   activating at least one of the control chains by the control module when a total current of the control chains being activated is less than a sum of maximum inrush currents of the voltage control circuits.

19. The method of claim 18, further comprising:
   generating the control signal with a first pulse width to activate at least one of the control chains in a first time period; and
   generating the control signal with a second pulse width to keep a number of the control chains being activated in a second time period, wherein the first pulse width is longer than the second pulse width.

20. The method of claim 18, further comprising:
   generating the control signal with a first voltage level to activate at least one of the control chains in a first time period; and
   generating the control signal with a second voltage level to keep a number of the control chains being activated in a second time period, wherein the first voltage level is higher than the second voltage level.

* * * * *